United States Patent [19]

Sasaki et al.

[11] 4,327,399
[45] Apr. 27, 1982

[54] HEAT PIPE COOLING ARRANGEMENT FOR INTEGRATED CIRCUIT CHIPS

[75] Inventors: Etsuro Sasaki, Fuchu; Takaaki Ohsaki, Tokyo, both of Japan

[73] Assignee: Nippon Telegraph & Telephone Public Corp., Tokyo, Japan

[21] Appl. No.: 107,646

[22] Filed: Dec. 27, 1979

[30] Foreign Application Priority Data

Jan. 12, 1979 [JP] Japan .................................. 54-2408

[51] Int. Cl.³ ............................................. H05K 7/20
[52] U.S. Cl. .................. 361/385; 174/15 HP
[58] Field of Search .................. 357/81, 82; 361/381, 361/382, 385, 401; 174/15 HP; 165/32, 105

[56] References Cited

U.S. PATENT DOCUMENTS

| | | | |
|---|---|---|---|
| 2,958,021 | 10/1960 | Cornelison | 174/15 HP |
| 3,739,232 | 6/1973 | Grossman | 361/401 |
| 4,000,776 | 1/1977 | Kroebig | 165/105 |
| 4,037,270 | 7/1977 | Ahmann | 361/385 |
| 4,054,938 | 10/1977 | Morris, Sr. | 361/401 |
| 4,106,188 | 8/1978 | Sekhon | 29/631 |

FOREIGN PATENT DOCUMENTS 54-78670 6/1979 Japan .
54-78671 6/1979 Japan .

Primary Examiner—Gerald P. Tolin
Attorney, Agent, or Firm—Burgess, Ryan and Wayne

[57] ABSTRACT

A heat pipe structure comprises a wiring substrate consisting of ceramic or silicon having a cavity in the interior on the inner surface of which is formed a wick and which contains working fluid, and radiating fins formed at the end of the substrate. Integrated circuit elements, integrated circuits or integrated circuit devices are securely inserted in holes which are formed on the surface or the back of the substrate and which communicate with the cavity so that the wick on their backs is aligned with the wick on the inner surface of the cavity for directly cooling the integrated circuit elements, the integrated circuits or the integrated circuit devices.

13 Claims, 12 Drawing Figures

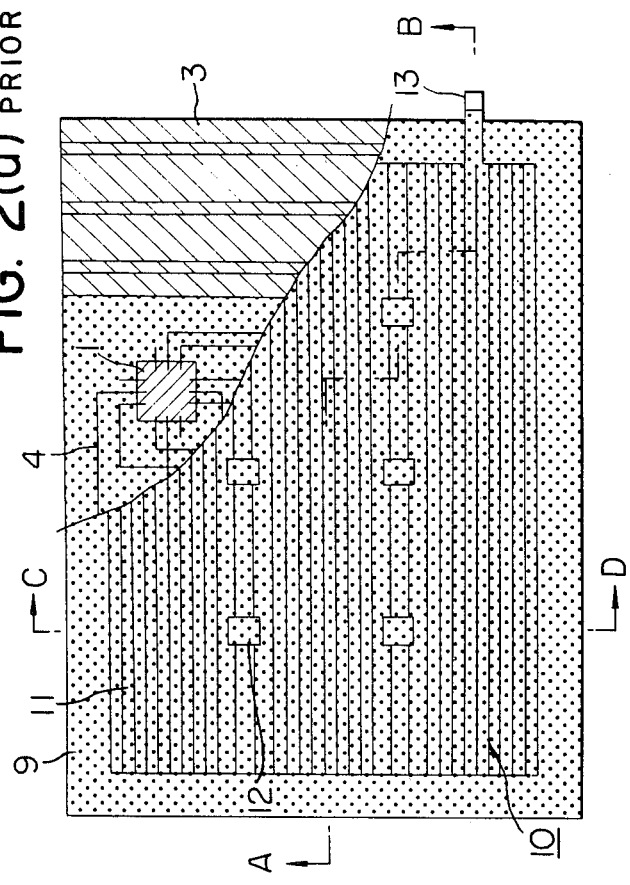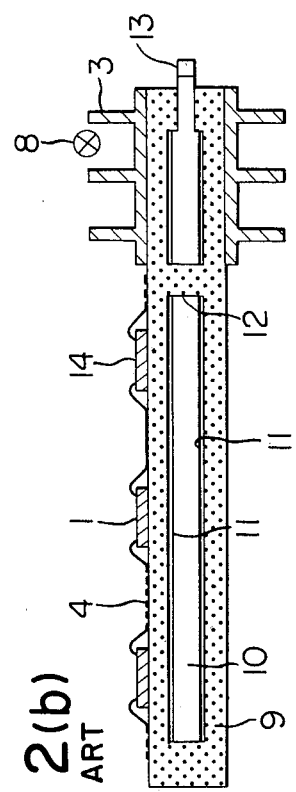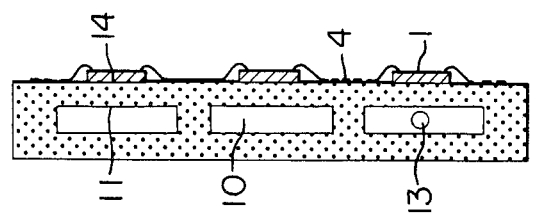

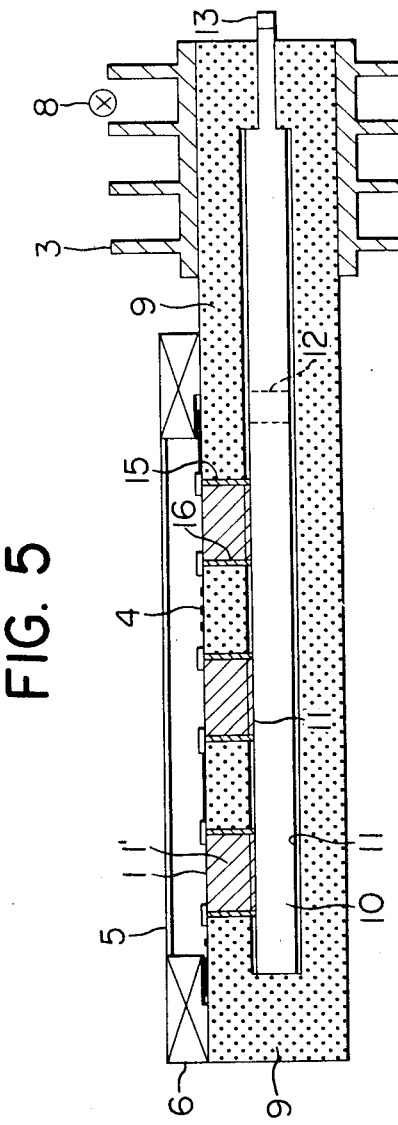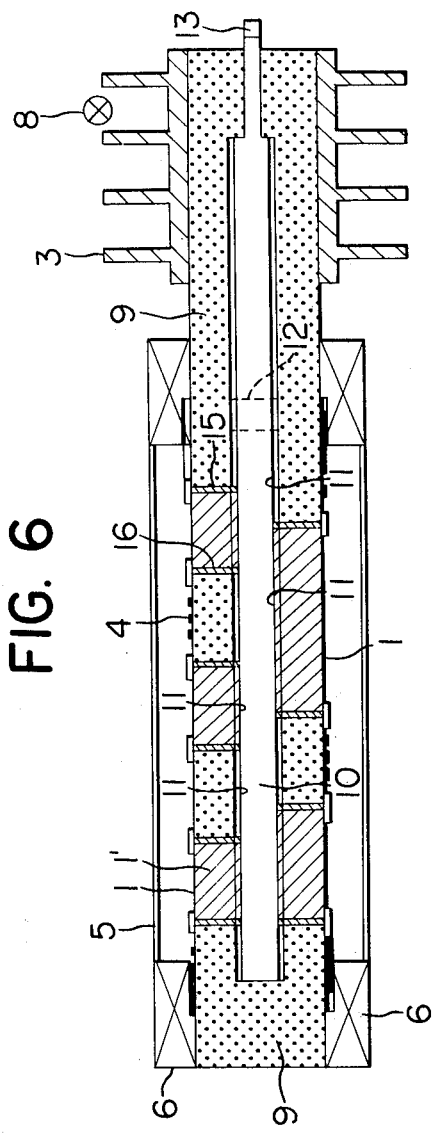

HEAT PIPE COOLING ARRANGEMENT FOR INTEGRATED CIRCUIT CHIPS

BACKGROUND OF THE INVENTION

This invention relates to an integrated circuit construction for mounting high density integrated circuit elements.

As information processing apparatus are recently requiring better and better performance, the packing density of memory, logic and other devices constituting the apparatus is drastically increased. As the packing density increases, the amount of heat per unit volume increases. The effective removal of this heat becomes a problem. Most of the information processing apparatus used at present, however, have forced-air cooling systems using a fan with about 0.03 W/cm$^3$ of cooling capacity and have an upper limit on density since a passage for the flow of air must be provided for each substrate.

To overcome this defect, a ceramic wiring substrate of heat pipe structure (Laid open Japanese Pat. publication No. 78670/79) has been proposed. This heat pipe structure substrate has a cavity on the inner surface of which is disposed a capillary structure called a wick. The interior of this cavity contains an appropriate amount of working fluid such as pure water, alcohol, etc., decompressed to a predetermined vapor pressure and sealed. The ceramic substrate has radiating fins at the end and supports integrated circuit elements mounted on it.

The integrated circuit device thus constituted does not need a circulation of cool air through the element mounting zone, but can separate the element mounting zone from the heat radiating zone so that the element mounting zone can be densely packed. However, since the integrated circuit elements are mounted on the ceramic substrate through adhesives such as alloy solder, resin, etc., heat which is produced by the integrated circuit elements and which reached the wick within the cavity encounters a large thermal resistance. Thus, to reduce the thermal resistance encountered in mounting these high density integrated circuit elements on the ceramic substrate, a higher air velocity and therefore a large-scale cooling device such as a fan or the like are disadvantageously needed.

SUMMARY OF THE INVENTION

Accordingly, an object of this invention is to provide a high density integrated circuit construction in which single crystal substrates of semiconductors with integrated circuit elements and integrated circuits formed therewith, or the single crystal substrates of semiconductors with integrated circuit elements embedded therein are directly cooled.

The integrated circuit construction according to this invention comprises a heat pipe structure wiring substrate having a cavity in its interior, a wick formed inside the cavity, and radiating fins at the end of the substrate surface; at least one hole provided in the heat pipe structure wiring substrate to communicate with said cavity; a single crystal silicon substrate for the semiconductor fixed securely to the hole or holes and disposed on the same side of the cavity as the wick; and a working fluid sealed in said cavity.

BRIEF DESCRIPTION OF THE DRAWINGS

FIG. 2(a) is a plan view showing a ceramic substrate of the prior art having a heat pipe structure;

FIG. 2(b) is a sectional view taken along the line A-B of FIG. 2(a);

FIG. 2(c) is a sectional view taken along the line C-D of FIG. 2(a);

FIG. 5 is a sectional view of FIG. 4;

FIG. 6 is a sectional view of the second embodiment of this invention;

DESCRIPTION OF THE PREFERRED EMBODIMENTS

Figure 1:
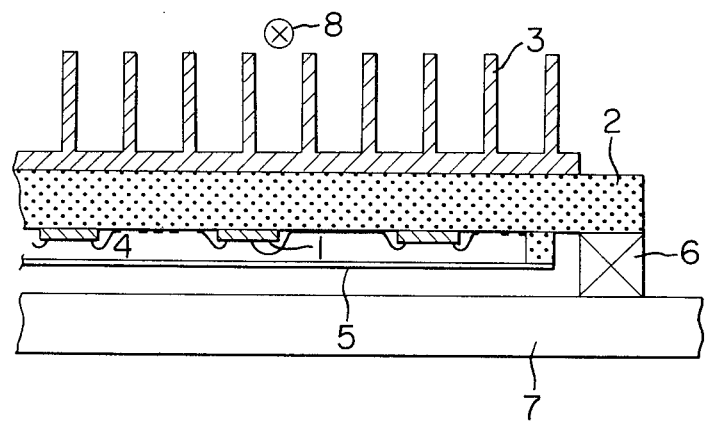
FIG. 1 shows an air-cooled mounting structure of the prior art.

Before the description of this invention, embodiments of the prior art will be now described. FIG. 1 is a sectional view showing a prior art air-cooled type integrated circuit device in which a plurality of integrated circuit elements 1 are provided under a substrate 2, radiating fins 3 are provided on the opposite side of the substrates, and wiring 4 is provided between the integrated circuit elements 1. A case 5 protects these elements 1 and the wiring 4. Also, the wiring 4 is connected to a wiring plate 7 through a connector 6.

This air-cooled type integrated circuit device needs to guide cooling air 8 through the radiating fins 3. When a plurality of these structures are combined, each substrate needs its own cooling air path. Thus, the integrated circuit elements 1 can not be mounted with high density.

Next, FIG. 2 shows a ceramic wiring substrate of heat pipe structure. A cavity 10 is provided in the ceramic wiring substrate 9 and a wick 11 of capillery structure is disposed on the inner surface of this cavity 10. Also, in the interior of the cavity 10 are a plurality of struts 12. The interior of the cavity 10 contains a working fluid, such as pure water, alcohol, etc., decompressed to a predetermined vapor pressure, and then sealed at a sealing port 13.

To the upper surface of the ceramic wiring substrate 9 is bonded a single crystal silicone substate of integrated circuit elements 1 by means of adhesives 14 and wiring 4. Radiating fins 3 are provided at the end of the substrate 9.

In the integrated circuit device of heat pipe structure thus constituted, heat produced in the integrated circuit elements 1 is dissipated by evaporating the fluid in the wick 11 with the capillary structure. Gas produced by the evaporation of the working fluid moves within the cavity, is distributed beneath the radiation zone, is condensed by cooled air 8 passing through the radiating fins 3, is liquefied again and penetrates beneath the integrated circuit elements 1 through the wick 11.

Figure 3:
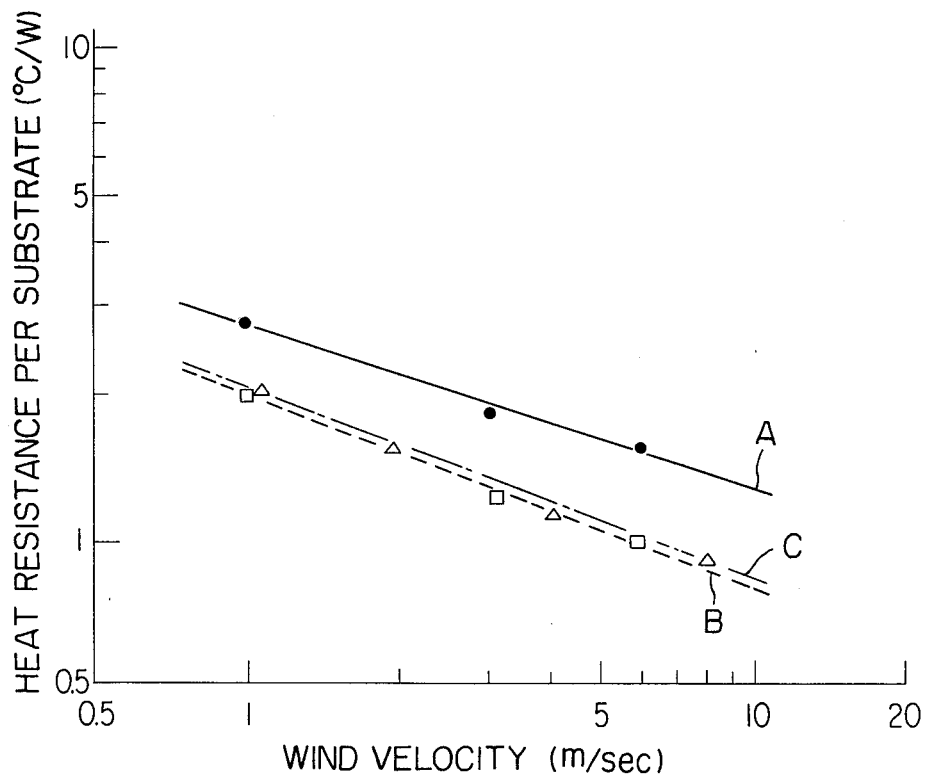
FIG. 3 is a graph showing the relationship between thermal resistance of the substrate and air velocity.

FIG. 3 shows a comparison example of thermal resistance when multi-chips of integrated circuit elements are mounted on various ceramic substrates. In FIG. 3, A designates the case of a ceramic substrate of dimensions 100 mm × 100 mm, B the case in which radiating aluminum fins are attached to the back of the substratum to attain a total radiating area equal to about twice that of A, and C the case in which semiconductor elements are mounted on a 100 mm×100 mm zone of a ceramic substrate of heat pipe structure of dimensions 100 mm×150 mm, with radiating fins mounted on the remaining 100 mm×50 mm zone (about 2.5 times the radiating area of A). The cooling air in the case of A and B passes by both sides of the substrate to cool the whole substrate, but in the case of C it passes through only a portion of the radiating fins.

In FIG. 3, it is found that the ceramic substrate of heat pipe structure of case C exhibits approximately the same thermal resistance as that of the substrate with radiating fins of case B. Also, in case C, the element mounting zone does not need a flow of cooling air and can be separated from the radiating zone so that the elements can be mounted with high density. In the ceramic substrate of heat pipe structure shown in FIG. 2, however, heat produced in the integrated circuit elements 1 and reaching the wick 11 encounters large thermal resistance, since the integrated circuit elements 1 are mounted on the ceramic substrate 9 through adhesives 14 such as alloy solder, resin, etc. Thus, to reduce the thermal resistance of the substrates in order to pack the circuit elements more densely, a high air velocity is needed, resulting disadvantageously in the need for a cooling device such as a fan or other large-scale device.

Figure 4:
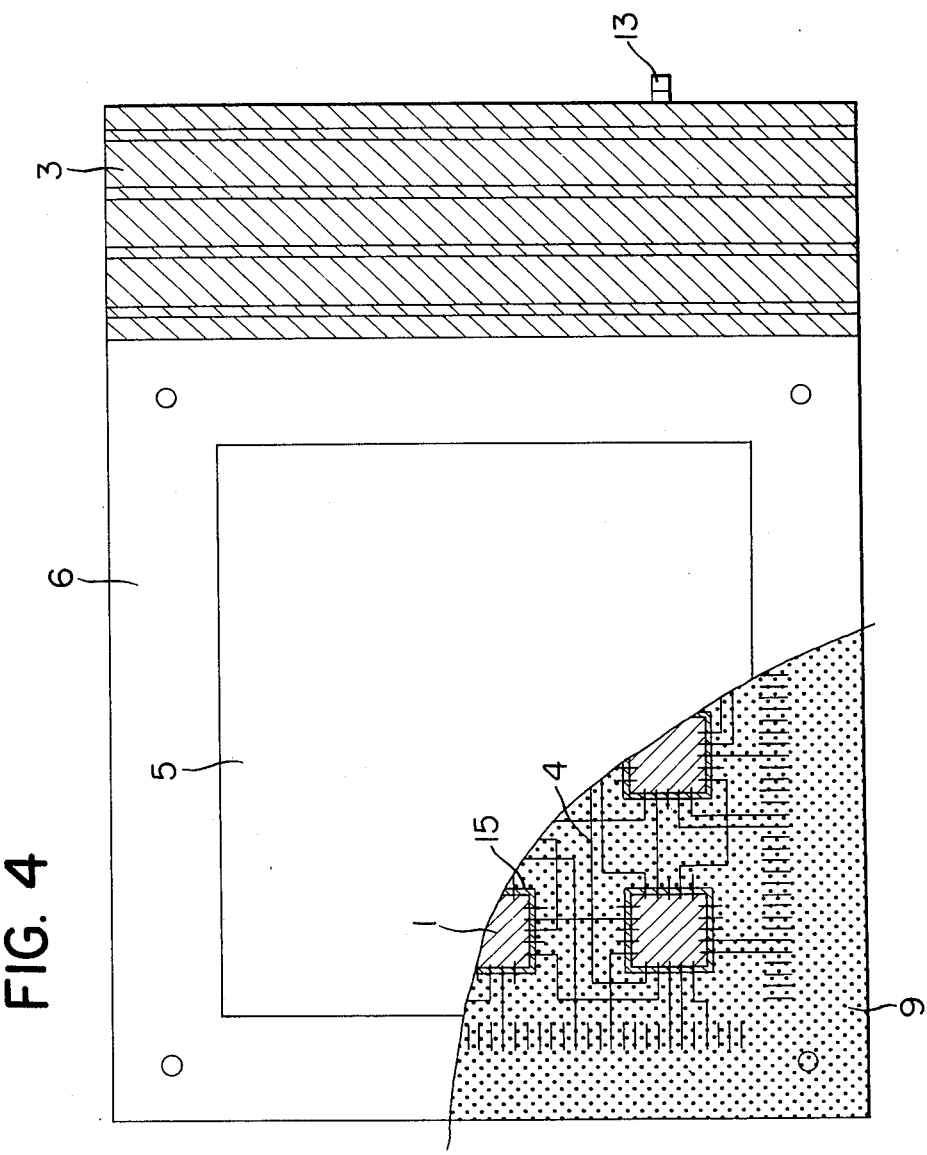
FIG. 4 is a plan view showing the first embodiment of this invention.

Next, several embodiments of this invention will be described. FIGS. 4 and 5 show the first embodiment of this invention. On the upper surface of a ceramic wiring substrate 9 of heat pipe structure are formed an appropriate number of holes 15 communicating with a cavity 10 and having integrated circuit elements 1 therein. Also, on the back of the integrated circuit elements 1, a wick 11 is formed by chemical etching, machining, etc. Semiconductors 1' are embedded in these holes 15 and fixed thereto by adhesives 16. Next, connectors 6 are attached to the substrate 9 and protected by a case 5. Finally a proper amount of working fluid, such as pure water, alcohol, etc., is put into the cavity 10 of the substrate 9. The interior of the cavity is decompressed to a predetermined vapor pressure and then sealed at a sealing port 13.

Since, on the back of the integrated circuit elements 1 is formed a wick 11 which is part of the heat pipe structure, the thermal resistance is extremely small. Also, since the variation of the thermal resistance within the substrate is small, the location of each element need not be changed according to the power consumption. Further, since the element mounting zone is separated from the radiating zone, a high density element mounting zone can be obtained. Also, since the connectors 6 can be provided on four sides of the substrate, a plurality of terminals are possible.

Further, the holes 15 mounting the integrated circuit elements 1 can be provided not only on the upper surface of the substrate 9, but also on the lower surface or on both surfaces.

A second embodiment of this invention will be described with reference to FIG. 6. In FIG. 6, a plurality of holes 15 are provided on the upper and lower surfaces of substrate 9. The integrated circuit elements 1 are embedded in these holes 15, fixed thereto with adhesives 16, provided with connectors 6 and protected by a case 5.

The second embodiment thus constituted can mount more integrated circuit elements than those of the first embodiment.

Figures 7A, 7B:
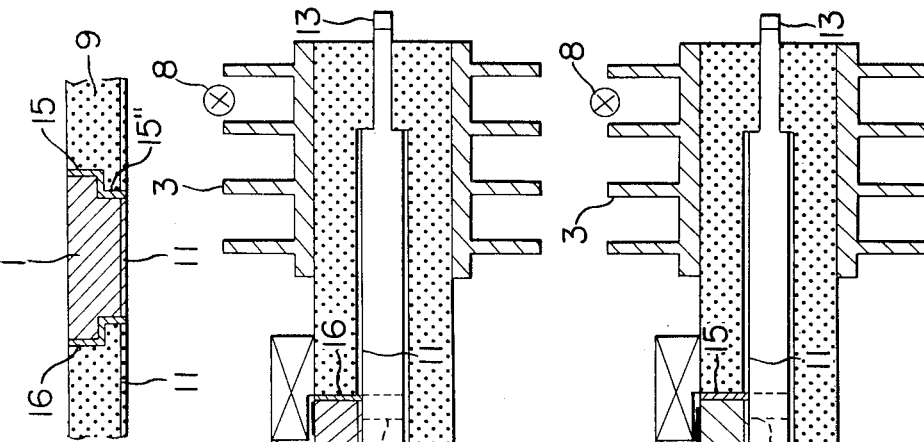
FIG. 7 is a sectional view showing another construction of holes.

Next, as shown in FIG. 7(a), the holes 15 may have a tapered portion 15' narrowing toward the cavity 10, or as shown in FIG. 7(b), may be provided at the cavity side with a projection 15 to prevent the integrated circuit elements 1 from dropping into the cavity when they are mounted, thus improving workability.

Also, soft alloy solders, such as indium-tin, indium-tin-lead, etc., can be used as adhesives 16. Further, not only pure water and alcohol, but also liquids such as ammonia and freon may be used as the working fluid.

Figure 8:
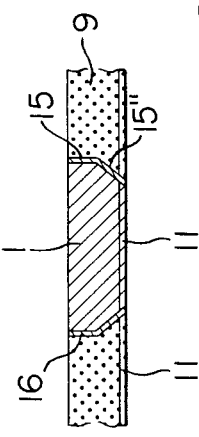
FIGS. 8 and 9 are, respectively, sectional views of the third and fourth embodiments of this invention.

Next, FIG. 8 shows a third embodiment of this invention. While the same numerals as these in FIGS. 4 and 5 designate the same parts, this embodiment illustrates the case of the full-wafer type LSI 17 wherein integrated circuit elements are bigger and an integrated circuit is formed on the entire surface of the semiconductor wafer. Also in this case, first a wick 11 is formed on the back of a single crystal silicon substrate 17' of the full-wafer type LSI 17 by chemical etching, machining, etc., for facilitating embodiment.

Figure 9:
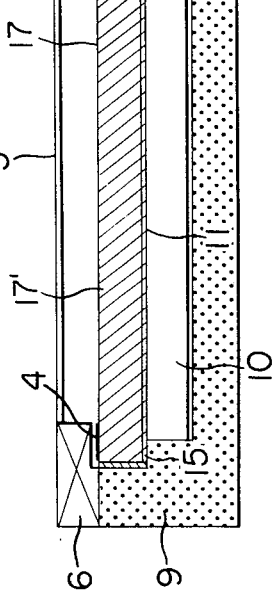

FIG. 9 shows a fourth embodiment of this invention in which the same numerals as those in FIGS. 4 and 5 designate the same parts, a single crystal substrate like silicon semiconductor wafer being designated by numeral 18 and a cavity formed therein by numeral 19.

In the silicon substrate 18 in this embodiment is a cavity 19 in which integrated circuit elements 1 are embedded, and a wick 11 is provided on the back of the silicon substrate 18.

Further, the second and third embodiments similar to the first one of this invention may be provided with holes 15 not only on the upper surface, but also on the lower surface or on both surfaces. In addition, the holes 15 may be tapered to be narrower toward the cavity side or provided at the cavity side with a projection to prevent the single crystal silicon substrate 17 or 18 from falling into the cavity when it is mounted, thus improving workability.

The radiating fins may be replaced by a water-cooled jacket. Further, silicon may be used for the substrate 9 of the second and third embodiments.

As previously described, according to this invention, on the back of the integrated circuit elements is formed a wick which becomes part of the heat pipe structure. Hence, the thermal resistance of the elements is extremely small and the dispersion of same within the substrate is small, so that each element does not need to be located in consideration of power consumption for facilitating design, and further, the element mounting zone can be separated from the radiating zone so that the distance between substrates can be reduced to shorten wire length and attain high packing density of elements.

What is claimed is:

1. An integrated circuit construction comprising a heat pipe structure wiring substrate having a cavity in its interior, a heat pipe wick on the inner surface of said cavity, and a cooling device attached on the end of said substrate; at least one hole provided in this heat pipe structure wiring substrate to communicate with said cavity; a single crystal substrate with semiconductor integrated circuit devices attached thereto securely fixed within this hole and with a wick similar to said heat pipe wick disposed on the inner surface of the cavity; and a working fluid sealed within said cavity and directly contacting said single crystal substrate via said single crystal substrate wick.

2. An integrated circuit construction as defined in claim 1 in which said heat pipe structure substrate is made of ceramic.

3. An integrated circuit construction as defined in claim 1 in which said heat pipe structure substrate is made of silicon.

4. An integrated circuit construction as defined in claim 1 in which integrated circuit elements are provided on said single crystal substrate for semi.

5. An integrated circuit construction as defined in claim 1 in which an integrated circuit is formed on the entire surface of said single crystal substrate for.

6. An integrated circuit construction as defined in claim 4 in which the integrated circuit elements are embedded in at least one recess provided on said single crystal substrate for.

7. An integrated circuit construction as defined in claim 1 in which said working fluid comprises any one of fluid pure water, alcohol, ammonia, freon, etc.

8. An integrated circuit construction as defined in claim 1 in which said cooling device comprises air-cooled radiating fins.

9. An integrated circuit construction as defined in claim 1 in which said cooling device comprises a water-cooled jacket.

10. An integrated circuit construction as defined in claim 1 in which said hole is tapered.

11. An integrated circuit construction as defined in claim 1 in which said hole is provided with a projection extending from the wiring substrate.

12. An integrated circuit construction as defined in claim 1 in which a plurality of said holes communicating with the cavity are provided on an upper, lower or both surfaces of the wiring substrate.

13. An integrated circuit construction as defined in claim 1 in which a soft alloy solder, such as indium-tin, indium-tin-lead, etc., is used as adhesive between said hole communicating to the cavity and the single crystal substrate.

* * * * *

UNITED STATES PATENT AND TRADEMARK OFFICE
CERTIFICATE OF CORRECTION

PATENT NO. : 4,327,399
DATED : April 27, 1982
INVENTOR(S) : Etsuro Sasaki, et al It is certified that error appears in the above—identified patent and that said Letters Patent is hereby corrected as shown below:

Claim 4, line 3: "for semi" should be deleted

Claim 5, line 3: "for" should be deleted

Claim 6, line 3: "for" should be deleted

Signed and Sealed this

First Day of March 1983

[SEAL]

Attest:

GERALD J. MOSSINGHOFF

Attesting Officer

Commissioner of Patents and Trademarks